United States Patent [19]

Lepetit et al.

[11] Patent Number: 4,730,157
[45] Date of Patent: Mar. 8, 1988

[54] CIRCUIT FOR THE REAL TIME ANALYSIS OF THE ENERGY DISTRIBUTION OF PULSES OF A PULSE SIGNAL

[75] Inventors: Jean L. Lepetit, Chevigny St. Sauveur; Jean P. Lepagnot, St. Seine L'Abbaye; Emile Poussier, Is/Tille, all of France

[73] Assignee: Commissariat a l'Energie Atomique, Paris, France

[21] Appl. No.: 838,951

[22] Filed: Mar. 12, 1986

[30] Foreign Application Priority Data

Mar. 25, 1985 [FR] France ............................... 85 04403

[51] Int. Cl.[4] ............................................. G01R 23/16
[52] U.S. Cl. ............................... 324/77 A; 324/77 R; 328/115; 328/150
[58] Field of Search ................... 324/77 A, 77 R, 71.4; 377/10, 11, 12, 19; 364/416, 555; 328/115, 150

[56] References Cited

U.S. PATENT DOCUMENTS 2,806,651  9/1957  Fernsler ........................ 377/19
2,961,641  11/1960  Dewan et al. .................. 377/19

OTHER PUBLICATIONS

Nuclear Instruments & Methods, vol. 121, No. 3, 1974, pp. 567–572, North-Holland Publishing Co., Amsterdam, NL; G. E. O'Brien, et al.: "A Digital Gate Unit for Two-Parameter Multichannel Analysis": p. 567, FIG. 1; p. 569, paragraph 2.2; FIG. 3; p. 570, paragraph 2.3.
IEEE Transactions on Nuclear Science, vol. NS-16, No. 5, Oct. 1969, pp. 36–57, New York, U.S.; B. Soucek: "State of Art in Multichannel Pulse Data Analysis", p. 39, FIG. 4; p. 41, FIG. 6; p. 47, paragraph 7, FIG. 13; pp. 52–53, paragraph 10; FIG. 23.
IEEE Transactions on Biomedical Engineering, vol. BME-26, No. 7, Jul. 1979, pp. 436–440, IEEE, New York, U.S.; S. J. Rackham, et al.: "A Pulse Height Analyzer for Displaying Coulter Counter Particle Size Distributions", p. 437, FIG. 1; p. 438, FIGS. 2-3.
Radio Fernsehen Elektronik, vol. 27, No. 9, Sep. 1978, pp. 583–586, Berlin, DD; D. Lange: "Digitales Datenklassifiziergerat zur Aufnahme Empirischer Verteilungen".

*Primary Examiner*—Stewart J. Levy
*Assistant Examiner*—Louis M. Arana
*Attorney, Agent, or Firm*—Oblon, Fisher, Spivak, McClelland & Maier

[57] ABSTRACT

It comprises an analog-digital converter receiving the pulse signal and supplying, for each pulse, a first code representing the amplitude of said pulse, said first code being able to assume N values, a group of n scalers, in which $n < N$, each corresponding to an energy window and a coding means receiving said first code and supplying a second code for addressing one of the counting scales, whereby said second code can assume at least n values, the content of the addressed scaler being incremented, said coding means comprising a memory and a binary decoder, the memory having N storage cells and receiving the first code on its address input, the binary decoder being connected by its input to the data output of the memory and supplying the second code.

4 Claims, 3 Drawing Figures

CIRCUIT FOR THE REAL TIME ANALYSIS OF THE ENERGY DISTRIBUTION OF PULSES OF A PULSE SIGNAL

BACKGROUND OF THE INVENTION

The present invention relates to a circuit for the real time analysis of the energy distribution of the pulses of a pulse signal. In this circuit, the energy distribution of the pulses is defined by the counting of the number of pulses in predetermined energy windows or energy bands. This circuit makes it possible to analyze the energy distribution of non-stationary physical phenomena, such as the radioactive disintegration or decay of a radioactive substance.

It is known that the mass of a radioactive substance contained in a material constituted by several elements can be determined by the disintegration or decay rate of said substance. The particle or electromagnetic radiation associated with this decay has a perfectly defined energy. As each decay is converted into a pulse, the counting of the pulses falling in an energy window centred on said decay energy makes it possible to evaluate the decay rate of said substance. It should be noted that if the material has several radioactive substances, the mass of each of them can be determined if the energy windows associated with these radioactive substances are separate.

The counting rate in each energy window results from superimposing the decays of the radioactive substance and the background noise due to cosmic radiation and to the terrain where the measurement is performed. This background noise is evaluated by counting the pulses falling into an energy window which is independent of the other energy windows and in which no decay is possible due to an analyzed radioactive substance. The real decay rate of each analyzed radioactive substance is consequently determined by the counting rate in the associated energy window, less the counting rate due to the background noise.

The known circuits for analyzing the energy distribution of the pulses of a pulse signal comprise an analog-digital converter supplying a digital code representing the amplitude of the pulse received, a storage means having the same number of storage cells as there are possible values of the digital code and processing means for incrementing the content of the storage cell associated with the digital code supplied by the analog-digital converter.

When the count is finished, the informations contained in each storage cell represent the energy distribution of the measured phenomenon. This energy distribution is defined by the number of pulses per channel or energy level.

If it is wished to know the energy distribution of the pulses of the signal measured by energy windows, it is necessary to add the numbers contained in all the channels corresponding to the same energy window. This treatment can only take place after the end of the analysis of the measured signal leading to a not insignificant paralysis time between two consecutive analyses.

SUMMARY OF THE INVENTION

The main object of the present invention is to eliminate this paralysis time, so that the energy distribution of the pulse signal by energy windows is available immediately after the end of the analysis of the measured signal.

For this purpose, the invention provides a group of n scalers, each corresponding to an energy window, the content of a scaler being incremented when the amplitude of the pulse received is in the energy band of the associated window. Thus, the energy distribution by energy window is carried out in real time.

More specifically, the present invention relates to a circuit for the real time analysis of the amplitude of the pulses of a pulse signal in energy windows, wherein it comprises an analog-digital converter receiving said pulse signal and supplying, for each pulse, a first code representing the amplitude of said pulse, said first code being able to assume N values, a group of n scalers in which $n<N$ in each case corresponds to an energy window and a coding means receiving said first code and supplying a second code for addressing one of the scalers, said second code being able to assume at least n values, the content of the addressed scaler being incremented, said coding means having a memory and a binary decoder, said memory comprising N storage cells and receiving the first code on its address input, the input of the binary decoder being connected to the data output of the memory and supplying the second code.

In this circuit, the content of a scaler is incremented when the first code representing the amplitude of a pulse is between two given values respectively representing the lower boundary and the upper boundary of the energy window. Generally, a scaler is associated with each energy window. However, it is also possible to associate several different energy windows with a single scaler.

In a preferred manner, one value of at least the second code is associated with energies outside the defined energy windows. This has the advantage that the sum of the values contained in the scalers is then equal to the number of pulses received, which is useful for studying the statistics of the energy of the pulses of the measured signal. The memory used can be a RAM or ROM, which can either be programable or reprogramable.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
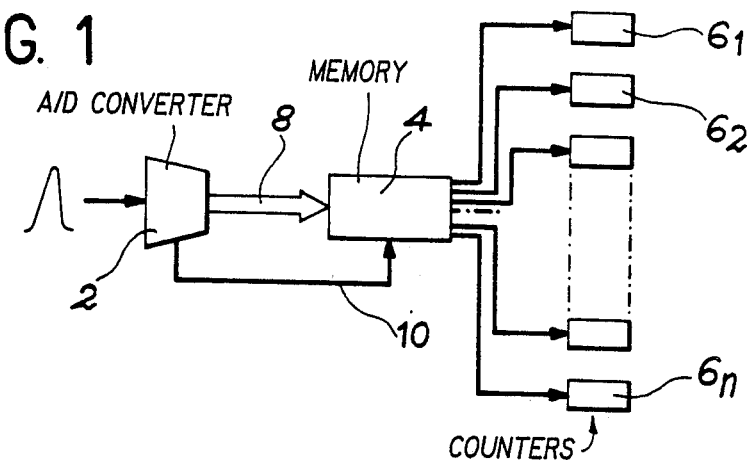
FIG. 1 Diagrammatically the analysis circuit according to the invention.

FIG. 1 diagrammatically shows the analysis circuit according to the invention. This circuit comprises an analog-digital converter 2, a coding means 4 and a group of scalers $6_1, 6_2 \ldots 6_n$. The analog-digital converter 2 receives the pulse signal. It supplies on a data channel 8 a first digital code representing the amplitude of a pulse received and on a control channel 10 a sync signal.

The first digital code can advantageously be a group of binary signals, e.g. a byte being able to represent 256 amplitude levels. The sync signal emitted on channel 10 makes it possible to receive the code emitted on channel 8 by the coding means 4. As a function of the value of said first code, the coding means 4 controls the incrementation of the content of one of the scalers $6_1$, $6_2$, ... $6_n$.

All the scalers, except possibly one scaler, are associated with an energy window and are incremented when the energy of the pulse received by the analog-digital converter 2 is between the lower and upper thresholds of the energy band associated with said scaler.

A given scaler can represent the energies outside the energy bands associated with the other scalers. This last scaler is consequently incremented when the intensity of the pulse received does not correspond to one of the given energy windows. The use of this scaler has the advantageous that the sum of the values contained in all the scalers is then equal to the sum of the pulses received by the circuit. This is indispensable for a precise statistical study of the energy distribution of the pulses of the signal received.

Figure 2:
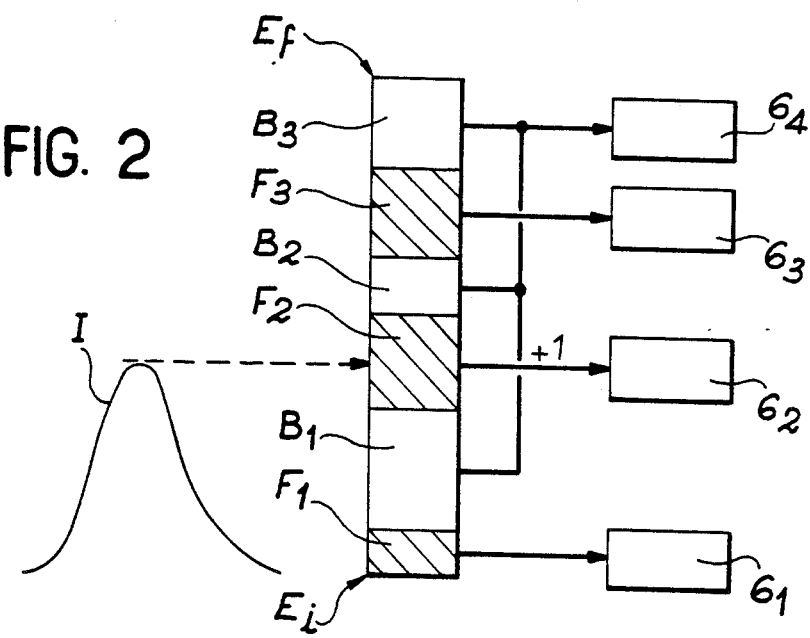
FIG. 2 The correspondence between the amplitude of a signal, the energy windows and the associated scalers.

FIG. 2 illustrates the correspondence between the intensity of a pulse, the given energy windows and the scalers. $E_1$ and $E_f$ designate the lower and upper energies of the energy band treated by the analysis circuit. For example, within said band has been defined three separate energy windows $F_1$, $F_2$ and $F_3$ giving three bands $B_1$, $B_2$ and $B_3$ in the band $[E_1, E_f]$.

The analysis circuit has four scalers $6_1$, $6_2$, $6_3$ and $6_4$. The first three scalers are respectively associated with the three energy windows $F_1$, $F_2$ and $F_3$, the fourth scaler being associated with bands $B_1$, $B_2$ and $B_3$.

FIG. 2 shows a pulse I, whose amplitude is between energies $E_i$ and $E_f$. More specifically, the amplitude of this pulse is between the boundaries of the energy window $F_2$. In this situation, the coding means of the circuit according to the invention controls the incrementation of the scaler $6_2$ associated with the said window $F_2$.

Figure 3:
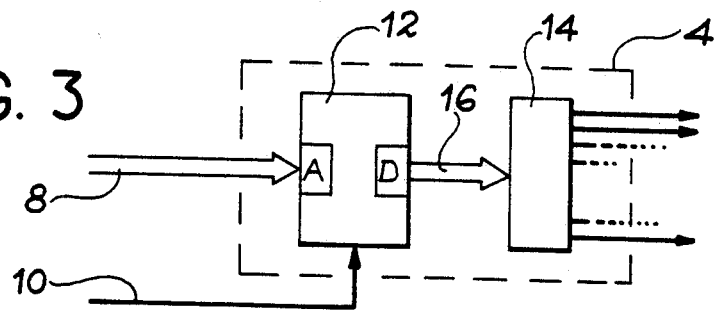
FIG. 3 In detailed form the coding means of the circuit according to the invention.

FIG. 3 shows in a more detailed manner the coding means of the circuit according to the invention. It comprises a memory 12 and a binary decoder 14. The address input of memory 12 is connected to channel 8, its data output is connected by a channel 16 to the input of binary coder 14. The selection of memory 12 is realized by the signal emitted on channel 10. The binary decoder 14 has p inputs and $n=2^p$ outputs, each output being connected to a scaler.

Memory 12 has at least N storage cells, each of which is associated with a given intensity of the pulse received. All the cells corresponding to a given energy window contain the same value. When the latter is transmitted by channel 16 to binary decoder 14, it makes it possible to activate the output of the binary decoder associated with the scaler corresponding to said energy window. Thus, the content of the scaler is incremented.

The Applicant has produced an analysis circuit in accordance with FIGS. 1 and 3. The analog-digital converter 2 is of the ADC 820 type, memory 12 of type 6166L-5, the binary decoder is of type HEF 4514 and the scalers are constituted by 82C54 circuits, each containing three scalers. In this circuit, the first code supplied on channel 8 is a byte and the second code supplied on channel 16 has four bits.

Apart from the elements shown in FIGS. 1 and 3, the analysis circuit according to the invention comprises, in a conventional manner, means for sequencing signals between the different elements of the circuit. It also advantageously comprises a processor, particularly when the memory is a RAM or an EPROM or EEPROM.

What is claimed is:

1. A circuit for the real time analysis of the amplitude of the pulses of a pulse signal, said analysis comprising counting the pulses appearing in each of a plurality of windows of energy, said circuit comprising:
   an analog-digital converter means receiving said pulse signal and supplying for each pulse a digital signal which is a function of the amplitude of said pulse,
   a memory means having locations, said memory means being addressed by said digital signal, each location containing a code indicating the window of energy corresponding to the amplitude of the pulse signal which corresponds to said location, said memory means supplying the code memorized in the location addressed by said digital signal,
   a decoder means having an input and a plurality of outputs, said decoder means receiving on said input said code from said memory means and supplying a signal on one of said outputs as a function of said code,
   a plurality of counting means, each counting means being connected to one output of said decoder means, and having means for storing the number of signals received from said decoder means.

2. A circuit according to claim 1, wherein the amplitude of the pulses are comprised in a predetermined range of amplitudes, and the windows of energy correspond to various portions of the range, said circuit having counting means for counting the pulses in each of the respective windows of energy and a supplementary counting means for counting the pulses which amplitude is not included in said windows of energy.

3. A circuit according to claim 1, wherein the memory means is a RAM.

4. A circuit according to claim 1, wherein the memory means is an EPROM or EEPROM.

* * * * *